United States Patent [19]
Kanbara et al.

[11] Patent Number: 5,344,499
[45] Date of Patent: Sep. 6, 1994

[54] ELECTRIC DEVICE OF HYDROGENATED AMORPHOUS SILICON AND METHOD OF MANUFACTURE

[75] Inventors: Teruhisa Kanbara, Ikeda; Shigeo Kondo, Hirakata, both of Japan

[73] Assignee: Matsushita Electric Industrial Co., Ltd., Osaka, Japan

[21] Appl. No.: 978,175

[22] Filed: Nov. 17, 1992

Related U.S. Application Data

[63] Continuation-in-part of Ser. No. 706,886, May 29, 1991, abandoned.

[30] Foreign Application Priority Data

Jul. 2, 1990 [JP] Japan .................................. 2-174743
Jul. 2, 1990 [JP] Japan .................................. 2-174751

[51] Int. Cl.$^5$ ............ H01L 31/0392; H01L 31/0376; H01L 31/20
[52] U.S. Cl. .................................... 136/258; 136/255; 257/53; 257/458; 437/3; 437/4; 437/173
[58] Field of Search ............... 136/255, 256, 258 AM; 437/3-4, 173, 180-181, 196-201, 241-248; 257/53, 55, 458

[56] References Cited

U.S. PATENT DOCUMENTS

| | | | |
|---|---|---|---|
| 4,117,506 | 9/1978 | Carlson et al. | 357/30 |
| 4,200,473 | 4/1980 | Carlston | 136/255 |
| 4,675,466 | 6/1987 | Ramaprasad | 136/244 |
| 4,770,716 | 9/1988 | Ramaprasad | 136/244 |
| 4,838,950 | 6/1989 | Ramaprasad | 136/244 |

OTHER PUBLICATIONS

T. Kanbara et al, *Jap. J. Appl. Phys.*, vol. 30, No. 8, Aug. 1991, pp. 1653–1658.
Denshi–Tsushin–Gakkai (Institute of Electronics and Communications), cover page & p. 256 of *LSI Handbook*, published Nov. 30, 1984.
S. Arimoto et al., "Anodic Oxydation For Enhancement of Fabrication Yield and Efficiency of Amorphous Silicon Solar Cells", in *Journal of the Electrochemical Society*, vol. 135, No. 2, pp. 431–436 (Feb. '88).
A. Madan et al., "Metal–Insulator–Semiconductor Solar Cells Using Amorphous Si:F:H Alloys", in *Applied Physics Letters*, vol. 37, No. 9, pp. 826–828 (Nov. '80).
M. Faraji et al., "Photovoltaic, I–V and C–V Characteristics of SnO$_2$/SiO$_2$/a-Si:H/mc-Si:H Structures", in *Japanese Journal of Applied Physics*, vol. 29, No. 11, pp. 2080–2081 (Nov. 1990).

*Primary Examiner*—Aaron Weisstuch
*Attorney, Agent, or Firm*—Ratner & Presita

[57] ABSTRACT

The electro-migration of electrode metal takes place under an elevated temperature condition in amorphous silicon devices having conventional PI-type, NI-type, or PIN-type hydrogenated amorphous silicon layered structures, which substantially degrades the electrical characteristics of the devices. This problem is solved by forming a chemically inactive layer consisting mainly of amorphous silicon oxide on the surface of amorphous silicon layer by an aqueous washing and drying process, to establish electrical contacts through the chemically inactive layer between the hydrogenated amorphous silicon layer and either a collector electrode or a transparent electrode. This structure not only prevents such electromigration of electrode metal, but it also allows a greater freedom for choosing a material for the collector electrode.

14 Claims, 2 Drawing Sheets

ELECTRIC DEVICE OF HYDROGENATED AMORPHOUS SILICON AND METHOD OF MANUFACTURE

This application is a continuation-in-part of application Ser. No. 07/706,886 filed May 29, 1991, now abandoned.

BACKGROUND OF THE INVENTION

INDUSTRIAL APPLICATION

This invention is related to the construction of photoelectric devices made of hydrogenated amorphous silicon, such as solar-cells and photo-sensors to convert near-ultraviolet, visible, or near-infrared light energies into electrical energy or changes in electrical resistance respectively.

PRIOR ARTS

Various constructions of solar-cells or photo-sensors made of hydrogenated amorphous silicon have been proposed. For example, an amorphous silicon solar-cell comprised of a transparent substrate, transparent electrode, P-I-N type hydrogenated amorphous silicon layer, and an aluminum collector electrode layer which are sequentially overlaid is known. An amorphous silicon photo-sensor comprised of a transparent substrate, transparent electrode, N-I-N type hydrogenated amorphous silicon layer and collector electrode which are sequentially overlaid is also known. This cell perceives light by detecting changes in electrical resistance between the transparent electrode and the collector electrode.

In such sensor devices a metal oxide such as tin-oxide ($SnO_2$) or indium oxide ($In_2O_3$) is employed to form the transparent electrode layer which sandwiches an I-type amorphous silicon layer against the collector electrode layer. A change in electrical current caused by light irradiation of the transparent electrode while applying a constant voltage between the transparent electrode and collector electrode is utilized for sensing the incident light.

However, it is generally difficult to establish and maintain adequately low electrical resistance between the transparent electrode layer and the collector electrode layer, through the I-type amorphous silicon layer (see e.g. Sensor Utilization Technology, published by the Association of Industrial Investigation of Japan).

Therefore, photo-sensor devices have generally been provided with either an N- or P-type hydrogenated amorphous silicon surface layer doped with either phosphorous or boron on a hydrogenated amorphous silicon layer provided between the transparent electrode and the collector electrode for increasing the carrier densities therein in order to establish substantially low electrical resistances between the transparent and collector electrode layers and the I-type amorphous silicon layer.

However, a substantial degradation is observed with solar-cells and photo-sensors having the above-described conventional construction when these are placed in a high-temperature environment on the order of 120° C. This phenomenon is attributed to a so-called metal migration caused by thermal diffusion of metal atoms from the electrodes into the amorphous silicon layer.

As an effective measure to prevent such metal migration from taking place in an elevated temperature environment, a method providing a chemically inactive electrical insulator between the amorphous silicon layer and the metal electrode layer was introduced.

For example, an electric device constructed of: a glass substrate/ ITO transparent electrode/ N-type hydrogenated amorphous silicon layer/ I-type hydrogenated amorphous silicon layer/ an insulator layer/ a collector electrode made of metal elements, has been proposed. A metal oxide such as $TiO_2$, $ZrO_2$, $SiO_2$, $Nb_2O_3$, $RuO_2$ was proposed for the insulator layer, and a higher work-function metal such as Pt, Au, or Pd was recommended for the collector electrode.

With an electrical device of such construction where a $TiO_2$ layer is employed as a chemically inactive electrical insulator for preventing thermal diffusion of platinum (which constitutes the collector electrode) into the amorphous silicon layer, the thickness of the $TiO_2$ layer must be so thin that quantum tunneling of electrons is possible at the boundary in order to assure an adequate electrical contact between the collector electrode layer and the amorphous silicon layer. However, but if the $TiO_2$ layer is too thin, it may not be able to prevent the thermal diffusion of platinum atoms from the electrode layer into the amorphous silicon layer.

Thus competing interests affect the construction of electric devices having the above-described construction: adequate electrical contact between the collector electrode layer and amorphous silicon layer; and the high-temperature stability of the device. Since the material constituting the collector electrode has to be a noble metal such as Pt, Au, or Pd, and the use of low-cost material such as aluminum is prohibited in this case, a higher production cost of such device is inevitable.

SUMMARY OF THE INVENTION

The present invention solves the above-described metal migration problems and offers a new stable photoelectrical device utilizing hydrogenated amorphous silicon and characterized by comprising a hydrogenated amorphous silicon layer; a chemically inactive layer which is formed on a surface of the hydrogenated amorphous silicon layer only by immersing the hydrogenated amorphous silicon layer in water and then drying the hydrogenated amorphous silicon layer under light irradiation, and is composed of hydrogenated amorphous silicon and $SiO_X$ and also is 50 to 300 Å in thickness; and an electrode layer which is formed on the chemically inactive layer by a vacuum deposition method.

Therefore, an improved electrical contact can be established between the hydrogenated amorphous silicon and the metal electrode through such a chemically inactive layer which prevents a direct contact of the hydrogenated amorphous silicon and the metal electrode.

In this case, adequate electrical contact can be established between the amorphous silicon and the electrode which may be made of a low cost metal such as aluminum. Furthermore, this electric device is stable at high-temperatures.

BRIEF DESCRIPTION OF THE DRAWINGS

FIG. 2 shows the high-temperature storage characteristics of electric devices A, B, and C, while

EMBODIMENTS OF THE INVENTION

Two embodiments of the invention are now illustrated in the following by referring to the attached drawings.

Embodiments-1

Electric Device A

Figure 1:
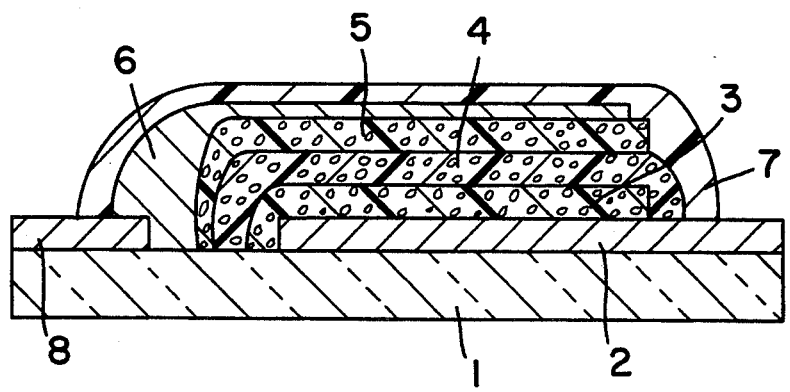
FIG. 1 shows a schematic cross-section of an electric device A of an embodiment of the present invention.

FIG. 1 shows a photo-detector device wherein electrical connection is established between a hydrogenated amorphous silicon layer and a collector electrode comprised mainly of metal elements, by using an oxide layer of the hydrogenated amorphous silicon layer. FIG. 1 shows such a photo-detector device fabricated on a 1.1 mm thick and 15×15 mm square glass substrate I on which a 10×10 mm ITO layer made of indium oxide and tin oxide is deposited at a thickness of 0.1 micron as a transparent electrode 2.

An 11×11 mm square N-type amorphous silicon layer 3 is deposited on the transparent electrode 2 at a thickness of 400 Å by a plasma CVD (Chemical Vapor Deposition) method. The deposition is conducted at a rate of 2 Å/sec in a mixed-gas atmosphere of $SiH_4 + P_2H_6$ ($P_2H_6/SiH_4 = 0.003$) at a pressure of 0.5 Torr, and a temperature of 220° C.

The I-type amorphous silicon layer 4 is continuously deposited at a thickness of 4000 Å by a plasma CVD method. The deposition is conducted at a deposition rate of 2 Å/sec in an atmosphere of $SiH_4$ gas at a pressure of 0.5 Torr and a temperature of 220° C.

Then, the surface of the I-type amorphous silicon layer 4 is washed in water for 10 minutes, and is dried in air for 10 minutes at 50° C. by applying infrared irradiation to form a chemically inactive layer 5 of the I-type amorphous silicon layer 4. In this process, drying temperature and time and syringe time did not affect the cell performance for the drying temperature range of 50° to 250° C. under light irradiation and for times in the range of 0.1 to 3 hours and for syringe times of 10 minutes to 5 hours.

After this, a 9×9 mm square aluminum collector electrode 6 is vacuum vapor deposited on chemically inactive layer 5 at a thickness of 2000 Å. The deposition is conducted at a deposition rate of 20 Å/sec in a vacuum atmosphere of $3 \times 10^{-5}$ Torr. The entire device construction is then sealed by a sealing layer 7 made of epoxy resin for completing the fabrication process of the photo-detector.

The lead terminal 8 for the ITO transparent electrode is fabricated at the time of the ITO transparent electrode fabrication. The thickness of chemically inactive layer 5 is determined, after the deposition of said aluminum collector electrode 6, by using a secondary-ion mass spectrometer, and it is found to be approximately 100 Å. Moreover, it is found that oxygen is homogeneously distributed in the aluminum collector electrode 6 at a content of 20 atom %.

Therefore, the construction of the photo-detector takes a final form of: a glass substrate/ ITO transparent electrode layers/ N-type hydrogenated amorphous silicon layer/ I-type hydrogenated amorphous silicon layer/ chemically inactive layer consisting mainly of the I-type hydrogenated amorphous silicon layer/ an (aluminum+oxygen) collector electrode layer.

Electric Device B

Another possible electric device, device B, has a different construction comprised of: a glass substrate/ ITO layer/ N-type hydrogenated amorphous silicon layer/ I-type hydrogenated amorphous silicon layer/ N-type hydrogenated amorphous silicon layer/ chemically inactive layer consisting mainly of the N-type hydrogenated amorphous silicon layer/ (aluminum+oxygen) layer.

Electric Device C

The electric device C has a still different device construction i.e.: a glass substrate / ITO layer/ N-type hydrogenated amorphous silicon layer/I-type hydrogenated amorphous silicon layer/P-type hydrogenated amorphous silicon layer/chemically inactive layer consisting mainly of the P-type hydrogenated amorphous silicon layer/(aluminum+oxygen) layer.

In fabricating electric device C, the P-type amorphous silicon layer is plasma CVD deposited at a thickness of 400 Å. The deposition is conducted at a deposition rate of 2 Å/sec in a mixed gas atmosphere of $SiH_4 + B_2H_5$ ($B_2H_5/SiH_4 = 0.003$) at a pressure of 0.5 Torr, and a temperature of 220° C.

COMPARATIVE EXAMPLE

Electric Device D.

For the purpose of comparative evaluation of these devices, a photo-sensor D having a conventional construction is fabricated. The device construction in this case is: a glass substrate / ITO layer/ N-type hydrogenated amorphous silicon layer / I-type hydrogenated amorphous silicon / N-type hydrogenated amorphous silicon layer / an aluminum layer.

A process virtually identical with that employed for the electric device A is employed for the electric device D (except that the washing and drying steps of the invention are not employed). That is, an aluminum electrode is directly deposited on an N-type hydrogenated amorphous silicon layer deposited previously on an I-type hydrogenated amorphous silicon layer. The deposition of the aluminum electrode is made at rate of 20 Å/sec by a vacuum deposition method conducted in an argon atmosphere at $1 \times 10^{-6}$ Torr.

The method of construction of the aforementioned N-type hydrogenated amorphous silicon layer is the same as that of the electric device A, and other constituting elements are also identical with those for the electric device A.

Figure 2:
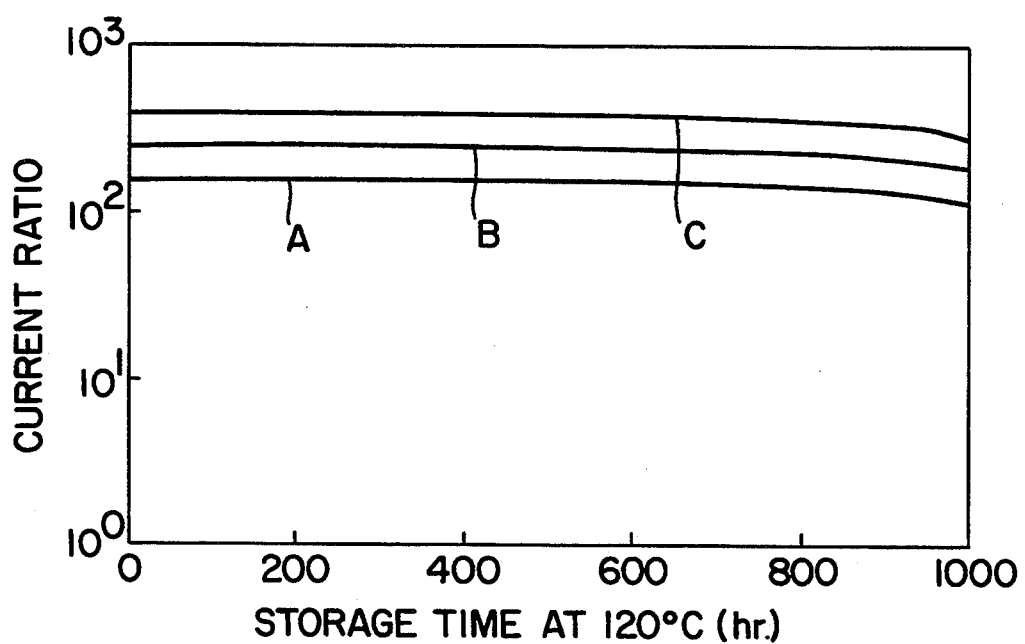
Figure 3:
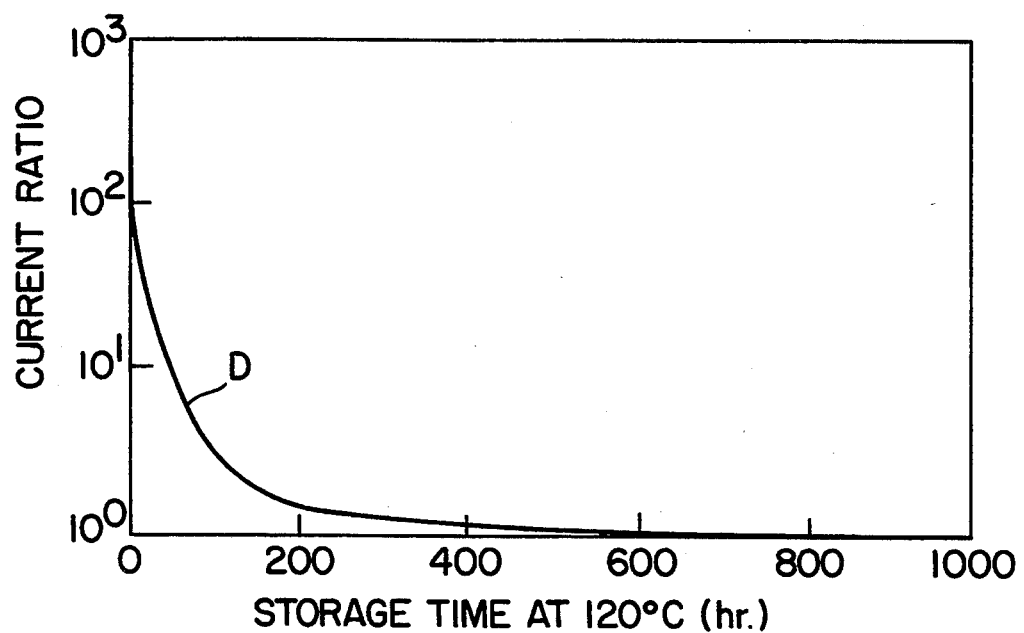
FIG. 3 shows high-temperature storage characteristics of a comparative electric device D.

The degradation of electric devices A, B, C and D during a high-temperature storage period was examined, and the results are shown in FIGS. 2 and 3.

Individual characteristics of these device are determined by measuring their respective current flows (the current when light irradiation is ON / the current when light irradiation is OFF) between the transparent electrode and the collector electrode when a constant voltage of 1 volt is applied to the devices at 120° C., and the light irradiation is turned ON and OFF.

A 550 nm monochromatic light source capable of delivering an irradiation intensity of 100 micro $W/cm^2$ was used in these experiments. FIGS. 2 and 3 show the current ratio or the gain of photo-sensor plotted on the vertical axis and the time exposed to the 120° C. atmosphere plotted along the horizontal axis.

As these results indicate, the electric devices A, B, and C, after undergoing a 120° C. storage test for 1000 hours, showed virtually no changes in the respective current ratios (FIG. 2) However, the degradation of the comparative electric device D from the initial stage is so significant (as shown in FIG. 3) that it became inoperative as a photo-sensing device within a short time period.

The same principles apply to electric devices having NI-type, NIN-type, or NIP-type constructions. The experiments obtained with devices having PI-type and PIN type structures also showed the same results. Furthermore, an experiment was conducted where the same device was constructed on an aluminum substrate, reversing the order of layer construction, and the same result was obtained.

Embodiments-2

Whereas, the electric device A shown in Embodiment-1 employs an aluminum collector electrode, electric devices using metals and alloys other than aluminum were experimentally fabricated, and these devices are designated E, F, G, H, I, and J. The materials employed for the collector electrode and the types and contents (atomic %) of non-metal elements contained therein are listed in Table 1.

The device construction and fabrication method for these devices are identical with those used for the electric device A in Embodiment-1 except for the collector electrode material. The collector electrode is deposited by means of an electron-beam deposition method.

TABLE I

| Device | Electrode Material | Non-metal Material | Non-metal Content (atomic %) |
|---|---|---|---|
| E | Al + Mg (95:5 atomic ratio) | Oxygen | 30 |
| F | Al + Ti (4:6 atomic ratio) | Oxygen | 5 |
| G | Al + Si (9:1 atomic ratio) | Oxygen | 10 |
| H | Ni | Oxygen | 5 |
| I | Ti | Nitrogen | 2 |
| J | Ti + Ni (1:1 atomic ratio) | Nitrogen | 1 |

Figure 4:
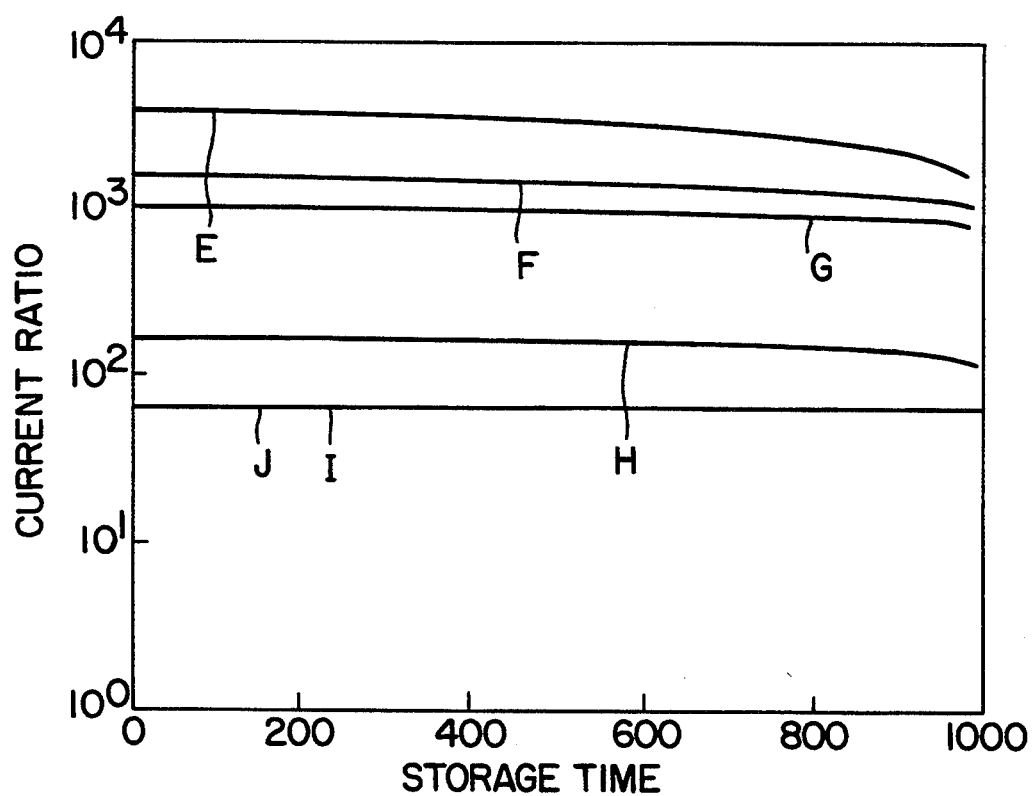
FIG. 4 shows high-temperature storage characteristics of electric devices E, F, G, H, I, and J having different collector electrode materials.

The light-sensitivities of these devices were measured by a method identical with that for the devices fabricated in Embodiment-1, and the results are reported in FIG. 4.

The results in FIG. 4 show improvement of the high-temperature storage characteristics of these devices over those of electric devices having conventional constructions.

In addition to the results obtained with various collector electrode materials shown in Table 1, various stainless steels, aluminum alloys, and nitrided steels were also tested. As a result of these experiments, it was confirmed that any single metal material or alloy of metals selected from the group of Li, Na, Mg, Al, Si, K, Ca, Ti, V, Cr, Mn, Fe, Ce, Ni, Cu, Zn, Ga, Ge, Zr, Nb, Mo, Pd, Ag, Cd, In, Sn, Ba, Ta, W, Pt, Au, and Pb can be used as a collector electrode material.

Furthermore, it is also confirmed that an addition of at least one non-metal element selected from the group including carbon, nitrogen, and oxygen in more than 1 atomic % is effective to improve the thermal stability of these electric devices. This effect can be attributed to the higher energy required to produce metal-migrations.

Confirmed also is a definite effectiveness of stainless steel, or such type material having better anti-corrosion properties, when these are employed to construct the collector electrode. It improves not only the high-temperature storage characteristics but the anti-humidity characteristics.

Embodiments-3

As a method of checking properties of chemically inactive layers, drying conditions after washing by water in the so-called washing and drying process as referred to in Embodiment-1 were examined. More specifically speaking, drying of amorphous layers was conducted both in the dark and under the irradiation from infrared lamps and fluorescent lamps and the results thereof were examined.

According to the results of examination, drying in the dark resulted in $V_{oc}=0.5$ V, $\eta=2\%$. On the other hand, drying under the light irradiation resulted in a high efficiency of $V_{oc}=0.86$, $\eta=5.2\%$ and an excellent reproducibility of the effectiveness to prevent migration of metals caused by heat application.

In other words, by drying under the light irradiation, baking is carried out while carriers in the amorphous silicon layer are in an excited state and the band structure within the inactive layer is affected one way or another resulting in formation of excellent electron conducting paths.

Furthermore, according to this embodiment, the substrate with the amorphous silicon layer formed on it was subjected to irradiation of 2000 1× in illuminance from infrared lamps and fluorescent lamps for 30 minutes at the ambient temperature of 100° C. However, the conditions such as light wave length, illuminance, etc. were not so restricting and, as far as the light wave length and illuminance were sufficient enough to cause an excitation to carriers in the amorphous silicon layer, certain properties were always obtainable.

Further details for practicing exemplary embodiments of the present invention are set forth in "A New Type of Amorphous Silicon Solar Cell with High Thermal Stability", Teruhisa Kanbara and Shigeo Kondo, in *Japanese Journal of Applied Physics*, Vol. 30, No. 8, pp. 1653–1658, August 1991, which is incorporated herein by reference.

We claim:

1. An electric device utilizing hydrogenated amorphous silicon and characterized by comprising at least:
    a hydrogenated amorphous silicon layer;
    a chemically inactive layer which is formed on a surface of said hydrogenated amorphous silicon layer only by immersing said hydrogenated amorphous silicon layer in water and then drying said hydrogenated amorphous silicon layer under light irradiation, and is composed of hydrogenated amorphous silicon and $SiO_X$ and also is 50 to 300 Å in thickness: and
    an electrode layer which is formed on said chemically inactive layer by a vacuum deposition method.

2. An electric device according to claim 1 wherein said electrode layer formed on said chemically inactive layer is a collector electrode.

3. An electric device according to claim 1 wherein said electrode layer formed on said chemically inactive layer is a transparent electrode.

4. An electric device according to claim 1 wherein said hydrogenated amorphous silicon layer comprises an I-type hydrogenated amorphous silicon layer, free of impurities, overlaid on one of:
    (a) a P-type hydrogenated amorphous silicon layer; or
    (b) an N-type hydrogenated amorphous silicon layer.

5. An electric device according to claim 1 wherein said hydrogenated amorphous silicon layer comprises an I-type hydrogenated amorphous silicon layer, free of impurities, sandwiched between one of:
 (a) a P-type and an N-type hydrogenated amorphous silicon layer; or
 (b) two N-type hydrogenated amorphous silicon layers.

6. An electric device according to claims 1, 2, 4, or 5 wherein said electrode layer comprises a metal or an alloy of metals selected from the group consisting of Mg, Al, Ti, Cr, Mn, Fe, Ni, Cu, Zn, Zr, Mo, Pd, Ag, In, Sn, Ta, W, Pt, Au, and Pb.

7. An electric device according to claim 6 wherein said electrode layer includes more than one atomic percent of an element selected from the group consisting of carbon, nitrogen, and oxygen.

8. A method of manufacturing an electric device which utilizes hydrogenated amorphous silicon, comprising the steps of:
 forming a chemically inactive layer that is composed of hydrogenated amorphous silicon and $SiO_x$ and is 50 to 300 Å thick on a surface of a hydrogenated amorphous silicon layer only by immersing said hydrogenated amorphous silicon layer in water and then drying said hydrogenated amorphous silicon layer under light irradiation; and thereafter forming an electrode layer on said chemically inactive layer by a vacuum deposition method.

9. A method of manufacturing an electric device utilizing hydrogenated amorphous silicon and characterized by comprising the steps of:
 before forming an electrode layer on a surface of a hydrogenated amorphous silicon layer formed on a substrate, immersing the surface of said hydrogenated amorphous silicon layer in water; and
 drying said hydrogenated amorphous silicon layer under light irradiation so as to form on the surface of said hydrogenated amorphous silicon layer a chemically inactive layer that is composed of hydrogenated amorphous silicon and $SiO_x$ and is 50 to 300 Å thick.

10. A method of manufacturing an electric device utilizing hydrogenated amorphous silicon according to claim 9, wherein the light irradiation is irradiation from infrared lamps and fluorescent lamps.

11. A method of manufacturing an electric device utilizing hydrogenated amorphous silicon according to claim 8, 9 or 10, wherein said electrode layer is a collector electrode.

12. A method of manufacturing an electric device utilizing hydrogenated amorphous silicon according to claim 8, 9 or 10, wherein said electrode layer is a transparent electrode layer.

13. A method of manufacturing an electric device utilizing hydrogenated amorphous silicon according to claim 8, 9 or 10, wherein said hydrogenated amorphous silicon layer formed on a substrate comprises an I-type hydrogenated amorphous silicon layer, free of impurities, overlaid on either a P-type or an N-type hydrogenated amorphous silicon layer.

14. A method of manufacturing an electric device utilizing hydrogenated amorphous silicon according to claim 8, 9 or 10 wherein said hydrogenated amorphous silicon layer formed on a substrate comprises either a P-type or an N-type hydrogenated amorphous silicon layer, an I-type hydrogenated amorphous silicon layer free of impurities, and either a P-type or an N-type hydrogenated amorphous silicon layer overlaid one after another in sequence.

* * * * *